(12) United States Patent  
Westerlaken et al.

(10) Patent No.: US 9,891,542 B2  
(45) Date of Patent: Feb. 13, 2018

(54) LITHOGRAPHIC APPARATUS AND DEVICE MANUFACTURING METHOD

(71) Applicant: ASML NETHERLANDS B.V., Veldhoven (NL)

(72) Inventors: Jan Steven Christiaan Westerlaken, Heesch (NL); Gerardus Arnoldus Hendricus Franciscus Janssen, Eindhoven (NL); Peter Paul Steijaert, Eindhoven (NL); Engelbertus Antonius Fransiscus Van Der Pasch, Oirschot (NL); Franciscus Van De Mast, Eindhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 0 days.

(21) Appl. No.: 15/387,461

(22) Filed: Dec. 21, 2016

(65) Prior Publication Data

US 2017/0242349 A1    Aug. 24, 2017

Related U.S. Application Data

(63) Continuation of application No. 14/657,772, filed on Mar. 13, 2015, now Pat. No. 9,529,277, which is a
(Continued)

(51) Int. Cl.
| | |
|---|---|
| *G03B 27/52* | (2006.01) |
| *G03B 27/42* | (2006.01) |
| *G03F 7/20* | (2006.01) |

(52) U.S. Cl.
CPC ........ *G03F 7/70916* (2013.01); *G03F 7/7085* (2013.01); *G03F 7/70341* (2013.01); *G03F 7/70683* (2013.01); *G03F 7/70775* (2013.01)

(58) Field of Classification Search
CPC ............ G03F 7/70341; G03F 7/70716; G03F 7/70775
(Continued)

(56) References Cited

U.S. PATENT DOCUMENTS

| | | |
|---|---|---|
| 4,509,852 A | 4/1985 | Tabarelli et al. |
| 6,559,922 B2 | 5/2003 | Hansell et al. |

(Continued)

FOREIGN PATENT DOCUMENTS

| | | |
|---|---|---|
| CN | 101046637 | 10/2007 |
| EP | 0 498 499 | 8/1992 |

(Continued)

OTHER PUBLICATIONS

Japanese Office Action dated Oct. 22, 2012 in corresponding Japanese Patent Application No. 2011-178217.
(Continued)

*Primary Examiner* — Hung Henry Nguyen  
(74) *Attorney, Agent, or Firm* — Pillsbury Winthrop Shaw Pittman, LLP

(57) ABSTRACT

A lithographic apparatus having a first outlet to provide a thermally conditioned fluid with a first flow characteristic to at least part of a sensor beam path, and a second outlet associated with the first outlet and to provide a thermally conditioned fluid with a second flow characteristic, different to the first flow characteristic, adjacent the thermally conditioned fluid from the first outlet.

20 Claims, 6 Drawing Sheets

Related U.S. Application Data continuation of application No. 13/214,289, filed on Aug. 22, 2011, now Pat. No. 8,988,650.

(60) Provisional application No. 61/376,653, filed on Aug. 24, 2010.

(58) Field of Classification Search
USPC .............................................. 355/30, 53, 72
See application file for complete search history.

(56) References Cited

U.S. PATENT DOCUMENTS

| | | | |
|---|---|---|---|
| 7,253,875 B1 * | 8/2007 | Luttikhuis | G03F 7/70775 |
| | | | 355/30 |
| 7,375,791 B2 * | 5/2008 | Vogel | G03F 7/70716 |
| | | | 355/30 |
| 7,405,811 B2 | 7/2008 | Beems et al. | |
| 7,924,399 B2 | 4/2011 | Van Der Ham et al. | |
| 8,988,650 B2 | 3/2015 | Westerlaken et al. | |
| 9,529,277 B2 | 12/2016 | Westerlaken et al. | |
| 2004/0136494 A1 | 7/2004 | Lof et al. | |
| 2004/0207824 A1 | 10/2004 | Lof et al. | |
| 2005/0157278 A1 | 7/2005 | Owa et al. | |
| 2006/0038968 A1 | 2/2006 | Kemper et al. | |
| 2006/0119809 A1 | 6/2006 | Verhagen et al. | |
| 2007/0046911 A1 | 3/2007 | Aichi | |
| 2007/0222906 A1 | 9/2007 | Van Der Ham et al. | |
| 2007/0288121 A1 | 12/2007 | Shibazaki | |
| 2008/0212046 A1 | 9/2008 | Riepen et al. | |
| 2009/0073397 A1 | 3/2009 | Vogel et al. | |
| 2009/0262318 A1 | 10/2009 | Van Den Dungen et al. | |
| 2009/0279060 A1 | 11/2009 | Direcks et al. | |
| 2009/0279062 A1 | 11/2009 | Direcks et al. | |
| 2010/0134769 A1 | 6/2010 | Mulkens et al. | |
| 2010/0157263 A1 | 6/2010 | Van Eijk et al. | |
| 2010/0159399 A1 | 6/2010 | Vermeulen et al. | |
| 2011/0199601 A1 | 8/2011 | Kaneko et al. | |

FOREIGN PATENT DOCUMENTS

| | | |
|---|---|---|
| EP | 0 838 728 | 4/1998 |
| EP | 1 148 390 | 10/2001 |
| EP | 1 420 300 | 5/2004 |
| EP | 1 770 444 | 4/2007 |
| JP | 63-200090 | 8/1988 |
| JP | 3-252507 | 11/1991 |
| JP | 8-082509 | 3/1996 |
| JP | 10-092735 | 4/1998 |
| JP | 2007-115758 | 5/2007 |
| JP | 2007-142366 | 6/2007 |
| JP | 2007-251156 | 9/2007 |
| KR | 10-2006-0025189 | 3/2006 |
| KR | 10-2007-00900804 | 9/2007 |
| TW | 200734835 | 9/2007 |
| TW | 200739279 | 10/2007 |
| WO | WO 99/49504 | 9/1999 |
| WO | WO 01/84241 | 11/2001 |
| WO | WO 2005/022616 | 3/2005 |
| WO | WO 2005/064405 | 7/2005 |

OTHER PUBLICATIONS

Korean Office Action dated Mar. 11, 2013 in corresponding Korean Patent Application No. 10-2011-0083463.

Chinese Office Action dated Mar. 27, 2014 in corresponding Chinese Patent Application No. 2011102344473.1.

European Search Report and Written Opinion dated Oct. 12, 2011 in corresponding European Patent Application No. 11 174 617.8.

* cited by examiner

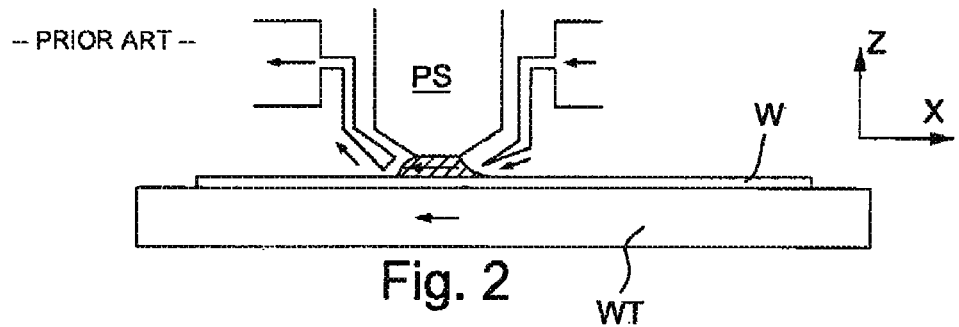
Fig. 2 — PRIOR ART —
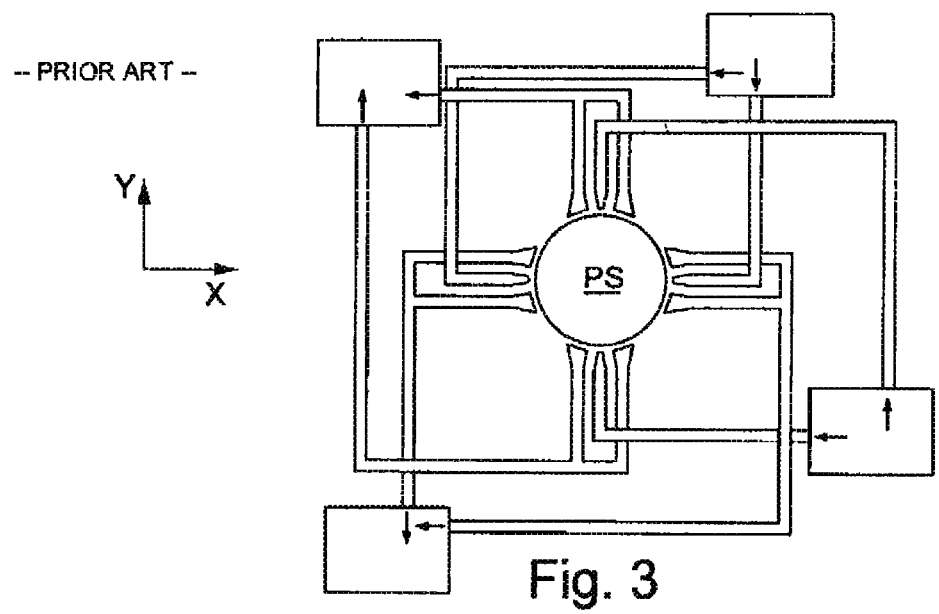
Fig. 3 — PRIOR ART —
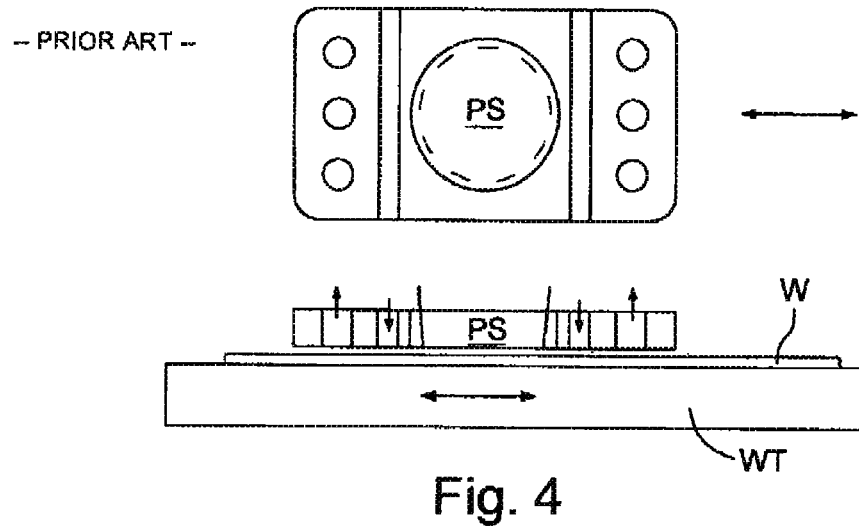
Fig. 4 — PRIOR ART —

– PRIOR ART –
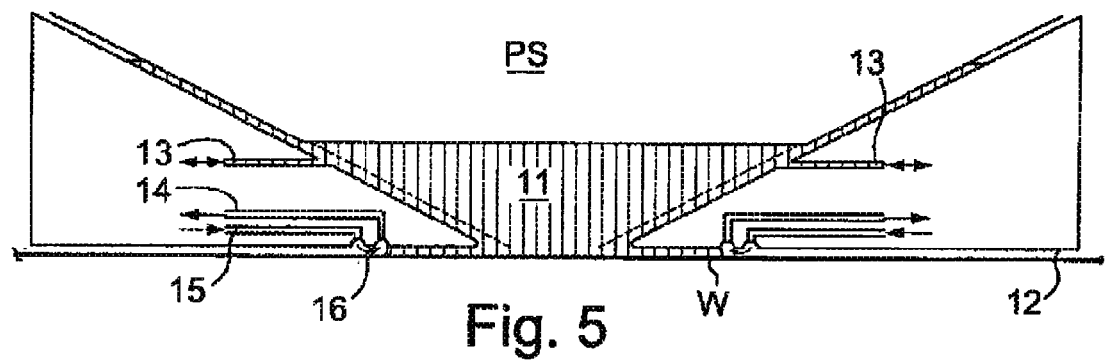
Fig. 5
Fig. 6
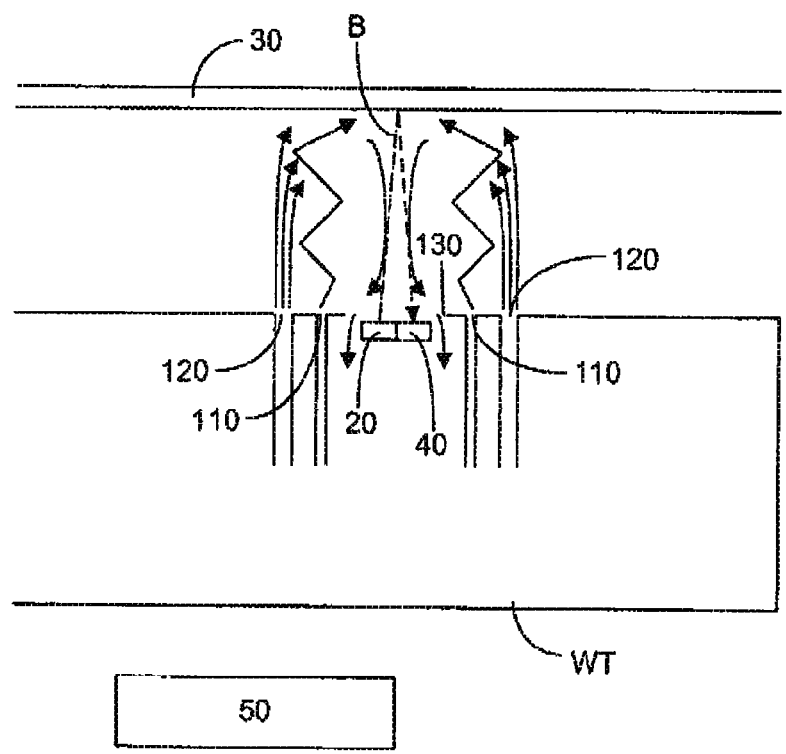

LITHOGRAPHIC APPARATUS AND DEVICE MANUFACTURING METHOD

This application is a continuation of U.S. patent application Ser. No. 14/657,772, filed Mar. 13, 2015, now U.S. Pat. No. 9,529,277, which is a continuation of U.S. patent application Ser. No. 13/214,289, filed Aug. 22, 2011, now U.S. Pat. No. 8,988,650, which claims priority and benefit under 35 U.S.C. § 119(e) to U.S. Provisional Patent Application No. 61/376,653, filed on Aug. 24, 2010. The content of each of the foregoing applications is incorporated herein in its entirety by reference.

FIELD

The present invention relates to a lithographic apparatus and device manufacturing method.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. In an embodiment, the liquid is distilled water, although another liquid can be used. An embodiment of the present invention will be described with reference to liquid. However, another fluid may be suitable, particularly a wetting fluid, an incompressible fluid and/or a fluid with higher refractive index than air, desirably a higher refractive index than water. Fluids excluding gases are particularly desirable. The point of this is to enable imaging of smaller features since the exposure radiation will have a shorter wavelength in the liquid. (The effect of the liquid may also be regarded as increasing the effective numerical aperture (NA) of the system and also increasing the depth of focus.) Other immersion liquids have been proposed, including water with solid particles (e.g. quartz) suspended therein, or a liquid with a nano-particle suspension (e.g. particles with a maximum dimension of up to 10 nm). The suspended particles may or may not have a similar or the same refractive index as the liquid in which they are suspended. Other liquids which may be suitable include a hydrocarbon, such as an aromatic, a fluorohydrocarbon, and/or an aqueous solution.

Submersing the substrate or substrate and substrate table in a bath of liquid (see, for example U.S. Pat. No. 4,509,852) means that there is a large body of liquid that must be accelerated during a scanning exposure. This requires additional or more powerful motors and turbulence in the liquid may lead to undesirable and unpredictable effects.

One of the arrangements proposed is for a liquid supply system to provide liquid on only a localized area of the substrate and in between the final element of the projection system and the substrate using a liquid confinement system (the substrate generally has a larger surface area than the final element of the projection system). One way which has been proposed to arrange for this is disclosed in PCT patent application publication no. WO 99/49504. As illustrated in FIGS. 2 and 3, liquid is supplied by at least one inlet IN onto the substrate, preferably along the direction of movement of the substrate relative to the final element, and is removed by at least one outlet after having passed under the projection system. That is, as the substrate is scanned beneath the element in a −X direction, liquid is supplied at the +X side of the element and taken up at the −X side. FIG. 2 shows the arrangement schematically in which liquid is supplied via inlet and is taken up on the other side of the element by outlet which is connected to a low pressure source. In the illustration of FIG. 2 the liquid is supplied along the direction of movement of the substrate relative to the final element, though this does not need to be the case. Various orientations and numbers of in- and out-lets positioned around the final element are possible, one example is illustrated in FIG. 3 in which four sets of an inlet with an outlet on either side are provided in a regular pattern around the final element. Arrows in liquid supply and liquid recovery devices indicate the direction of liquid flow.

A further immersion lithography solution with a localized liquid supply system is shown in FIG. 4. Liquid is supplied by two groove inlets on either side of the projection system PS and is removed by a plurality of discrete outlets arranged radially outwardly of the inlets. The inlets and can be arranged in a plate with a hole in its center and through which the projection beam is projected. Liquid is supplied by one groove inlet on one side of the projection system PS and removed by a plurality of discrete outlets on the other side of the projection system PS, causing a flow of a thin film of liquid between the projection system PS and the substrate W. The choice of which combination of inlet and outlets to use can depend on the direction of movement of the substrate W (the other combination of inlet and outlets being inactive). In the cross-sectional view of FIG. 4, arrows illustrate the direction of liquid flow in inlets and out of outlets.

In European patent application publication no. EP 1420300 and United States patent application publication no. US 2004-0136494, the idea of a twin or dual stage immersion lithography apparatus is disclosed. Such an apparatus is provided with two tables for supporting a substrate. Leveling measurements are carried out with a table at a first position, without immersion liquid, and exposure is carried out with a table at a second position, where immersion liquid is present. Alternatively, the apparatus has only one table.

PCT patent application publication WO 2005/064405 discloses an all wet arrangement in which the immersion liquid is unconfined. In such a system the whole top surface of the substrate is covered in liquid. This may be advantageous because then the whole top surface of the substrate is exposed to the substantially same conditions. This has an advantage for temperature control and processing of the substrate. In WO 2005/064405, a liquid supply system provides liquid to the gap between the final element of the projection system and the substrate. That liquid is allowed to leak over the remainder of the substrate. A barrier at the edge of a substrate table prevents the liquid from escaping so that it can be removed from the top surface of the substrate table in a controlled way. Although such a system improves temperature control and processing of the substrate, evaporation of the immersion liquid may still occur. One way of helping to alleviate that problem is described in United States patent application publication no. US 2006/0119809. A member is provided which covers the substrate W in all positions and which is arranged to have immersion liquid extending between it and the top surface of the substrate and/or substrate table which holds the substrate.

SUMMARY

In lithography, the measurement of one or more properties, for example position, is often performed by a sensor in which a beam of radiation is projected by an emitter onto a mark. The beam can be interfered with by anything in its path. That can result in an error being introduced into a reading, result in a reading not being made, or result in a reading being completely wrong.

It is desirable, for example, to reduce or eliminate the risk of error in sensor readings.

According to an aspect, there is provided a lithographic apparatus comprising: a sensor comprising an emitter to project a beam of radiation along a sensor beam path to a mark; a first outlet to provide a thermally conditioned fluid with a first flow characteristic to at least part of the sensor beam path; and a second outlet associated with the first outlet and to provide a thermally conditioned fluid with a second flow characteristic, different to the first flow characteristic, adjacent the thermally conditioned fluid from the first outlet.

According to an aspect, there is provided a lithographic apparatus comprising: a sensor comprising an emitter to project a beam of radiation along a sensor beam path to a mark; a first outlet to provide a turbulent fluid flow along the sensor beam path; and a second outlet to provide a laminar fluid flow substantially enclosing the turbulent fluid flow.

According to an aspect, there is provided a lithographic apparatus comprising: a table arranged to be positioned under a projection system; a fluid supply system to provide a fluid between the projection system and the table; a sensor to measure a position of the table relative to a reference position, the sensor comprising an emitter and a mark structure comprising a mark, the emitter being fixed relative to a reference position and the mark being positioned on the table, or the emitter being positioned on the table and the mark being fixed relative to a reference position; and an outlet to provide a flow of gas to move a droplet of liquid on and/or prevent a droplet of liquid moving onto the mark structure and/or the emitter.

According to an aspect, there is provided a device manufacturing method comprising projecting a patterned beam of radiation onto a substrate, wherein a property is measured by using an emitter to project a beam of radiation along a sensor beam path to a mark, and wherein a first flow of thermally conditioned fluid with a first characteristic is provided to at least part of the sensor beam path and a second flow of thermally conditioned fluid is provided with a second flow characteristic, different to the first flow characteristic, adjacent the thermally conditional fluid from the first outlet.

According to an aspect, there is provided a device manufacturing method comprising projecting a patterned beam of radiation through an immersion liquid onto a substrate positioned on a table, wherein a position of the table relative to a reference position is measured by using an emitter to emit a beam of radiation on to a mark of a mark structure, wherein the emitter is fixed relative to a reference position and the mark is positioned on the table or the emitter is positioned on the table and the mark is fixed relative to a reference position, and wherein a flow of gas is provided to move a droplet of liquid on and/or prevent a droplet of liquid from moving onto the mark structure and/or emitter.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIGS. 2 and 3 depict a liquid supply system for use in a lithographic projection apparatus;

FIG. 4 depicts a further liquid supply system for use in a lithographic projection apparatus;

FIG. 5 depicts, in cross-section, a barrier member which may be used in an embodiment of the present invention as an immersion liquid supply system;

FIG. 6 is a schematic illustration of a sensor, in cross-section, according to an embodiment of the present invention;

DETAILED DESCRIPTION

Figure 1:
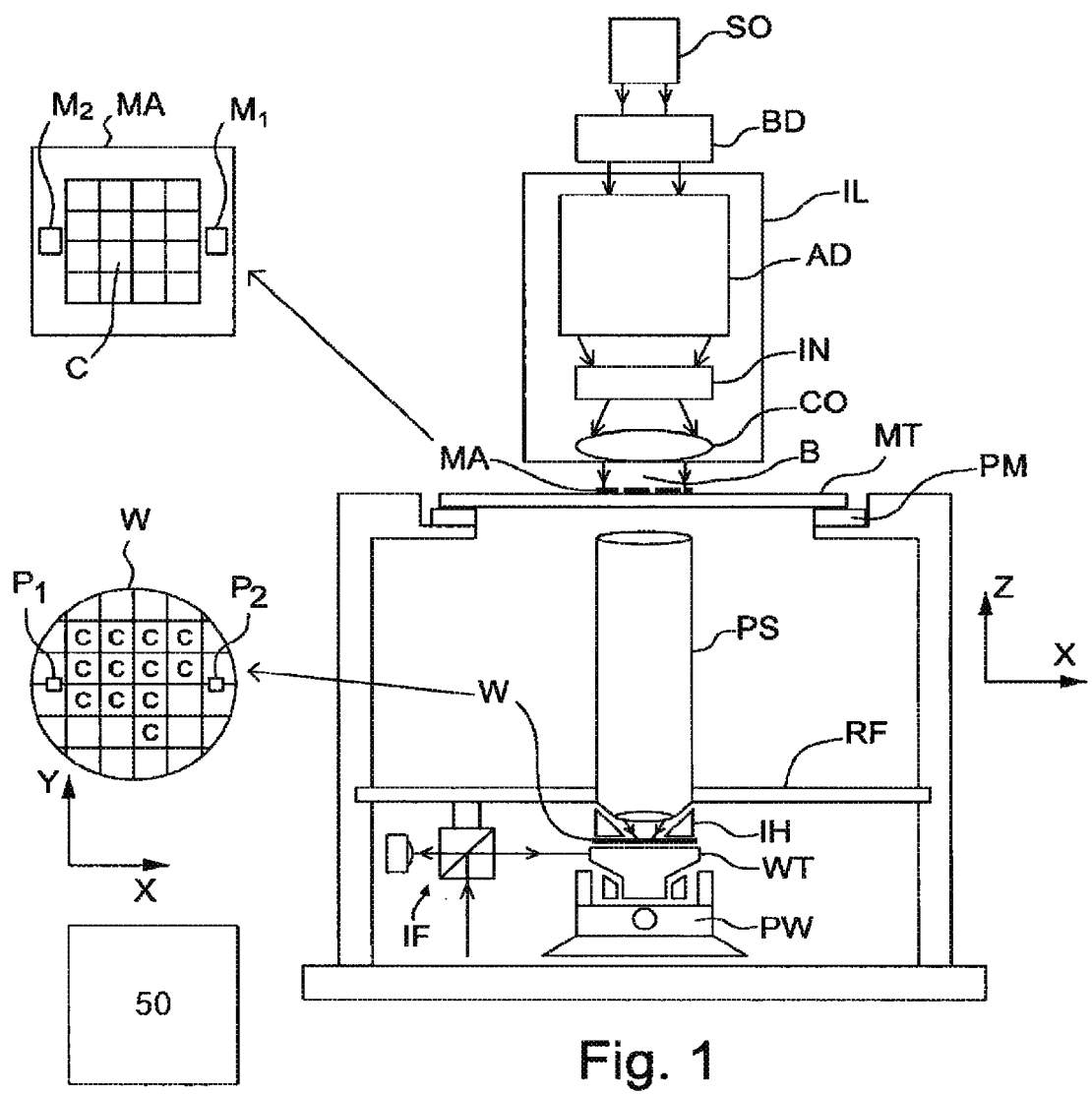
FIG. 1 depicts a lithographic apparatus according to an embodiment of the invention.

FIG. 1 schematically depicts a lithographic apparatus according to one embodiment of the invention. The apparatus comprises:

an illumination system (illuminator) IL configured to condition a radiation beam B (e.g. UV radiation or DUV radiation);

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device. The support structure MT holds the patterning device in a manner that depends on the orientation of the patterning device, the design of the lithographic apparatus, and other conditions, such as for example whether or not the patterning device is held in a vacuum environment. The support structure MT can use mechanical, vacuum, electrostatic or other clamping techniques to hold the patterning device. The support structure MT may be a frame or a table, for example, which may be fixed or movable as required. The support structure MT may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more patterning device tables). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section. Similar to the source SO, the illuminator IL may or may not be considered to form part of the lithographic apparatus. For example, the illuminator IL may be an integral part of the lithographic apparatus or may be a separate entity from the lithographic apparatus. In the latter case, the lithographic apparatus may be configured to allow the illuminator IL to be mounted thereon. Optionally, the illuminator IL is detachable and may be separately provided (for example, by the lithographic apparatus manufacturer or another supplier).

The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Arrangements for providing liquid between a final element of the projection system PS and the substrate can be classed into two general categories. These are the bath type arrangement in which the whole of the substrate W and optionally part of the substrate table WT is submersed in a bath of liquid and the so called localized immersion system which uses a liquid supply system in which liquid is only provided to a localized area of the substrate. In the latter category, the space filled by liquid is smaller in plan than the top surface of the substrate and the area filled with liquid remains substantially stationary relative to the projection system PS while the substrate W moves underneath that area. A further arrangement, to which an embodiment of the present invention is directed, is the all wet solution in which the liquid is unconfined. In this arrangement substantially the whole top surface of the substrate and all or part of the substrate table is covered in immersion liquid. The depth of the liquid covering at least the substrate is small. The liquid may be a film, such as a thin film, of liquid on the substrate. Any of the liquid supply devices of FIGS. 2-5 may be used in such a system; however, sealing features are not present, are not activated, are not as efficient as normal or are otherwise ineffective to seal liquid to only the localized area. Four different types of localized liquid supply systems are illustrated in FIGS. 2-5. The liquid supply systems disclosed in FIGS. 2-4 were described above.

Another arrangement which has been proposed is to provide the liquid supply system with a liquid confinement member which extends along at least a part of a boundary of the space between the final element of the projection system and the substrate table. Such an arrangement is illustrated in FIG. 5. The liquid confinement member is substantially stationary relative to the projection system in the XY plane though there may be some relative movement in the Z direction (in the direction of the optical axis). A seal is formed between the liquid confinement and the surface of the substrate. In an embodiment, a seal is formed between the liquid confinement structure and the surface of the substrate and may be a contactless seal such as a gas seal. Such a system is disclosed in United States patent application publication no. US 2004-0207824.

FIG. 5 schematically depicts a localized liquid supply system with a barrier member 12, IH. The barrier member extends along at least a part of a boundary of the space between the final element of the projection system and the substrate table WT or substrate W. (Please note that reference in the following text to surface of the substrate W also refers in addition or in the alternative to a surface of the substrate table, unless expressly stated otherwise.) The barrier member 12 is substantially stationary relative to the projection system in the XY plane though there may be some relative movement in the Z direction (in the direction of the optical axis). In an embodiment, a seal is formed between the barrier member and the surface of the substrate W and may be a contactless seal such as a fluid seal, desirably a gas seal.

The barrier member 12 at least partly contains liquid in the space 11 between a final element of the projection system PS and the substrate W. A contactless seal 16 to the substrate W may be formed around the image field of the projection system so that liquid is confined within the space between the substrate W surface and the final element of the projection system PS. The space is at least partly formed by the barrier member 12 positioned below and surrounding the final element of the projection system PS. Liquid is brought into the space below the projection system and within the barrier member 12 by liquid inlet 13. The liquid may be removed by liquid outlet 13. The barrier member 12 may extend a little above the final element of the projection system. The liquid level rises above the final element so that a buffer of liquid is provided. In an embodiment, the barrier member 12 has an inner periphery that at the upper end closely conforms to the shape of the projection system or the final element thereof and may, e.g., be round. At the bottom, the inner periphery closely conforms to the shape of the image field, e.g., rectangular, though this need not be the case.

In an embodiment, the liquid is contained in the space 11 by a gas seal 16 which, during use, is formed between the bottom of the barrier member 12 and the surface of the substrate W. The gas seal is formed by gas, e.g. air or synthetic air but, in an embodiment, $N_2$ or another inert gas. The gas in the gas seal is provided under pressure via inlet 15 to the gap between barrier member 12 and substrate W. The gas is extracted via outlet 14. The overpressure on the gas inlet 15, vacuum level on the outlet 14 and geometry of the gap are arranged so that there is a high-velocity gas flow 16 inwardly that confines the liquid. The force of the gas on the liquid between the barrier member 12 and the substrate W contains the liquid in a space 11. The inlets/outlets may be annular grooves which surround the space 11. The annular grooves may be continuous or discontinuous. The flow of gas 16 is effective to contain the liquid in the space 11. Such a system is disclosed in United States patent application publication no. US 2004-0207824.

The example of FIG. 5 is a so called localized area arrangement in which liquid is only provided to a localized area of the top surface of the substrate W at any one time. Other arrangements are possible, including fluid handling systems which make use of a single phase extractor or a two phase extractor as disclosed, for example, in United States patent application publication no US 2006-0038968. In an embodiment, a single or two phase extractor may comprise an inlet which is covered in a porous material. In an embodiment of a single phase extractor the porous material is used to separate liquid from gas to enable single-liquid phase liquid extraction. A chamber downstream of the porous material is maintained at a slight under pressure and is filled with liquid. The under pressure in the chamber is such that the meniscuses formed in the holes of the porous material prevent ambient gas from being drawn into the chamber. However, when the porous surface comes into contact with liquid there is no meniscus to restrict flow and the liquid can flow freely into the chamber. The porous material has a large number of small holes, e.g. of diameter in the range of 5 to 300 μm, desirably 5 to 50 μm. In an embodiment, the porous material is at least slightly liquidphilic (e.g., hydrophilic), i.e. having a contact angle of less than 90° to the immersion liquid, e.g. water.

Another arrangement which is possible is one which works on a gas drag principle. The so-called gas drag principle has been described, for example, in United States patent application publication nos. US 2008-0212046, US 2009-0279060 and US 2009-0279062. In that system the extraction holes are arranged in a shape which desirably has a corner. The corner may be aligned with the stepping or scanning directions. This reduces the force on the meniscus between two openings in the surface of the fluid handing structure for a given speed in the step or scan direction compared to if the two outlets were aligned perpendicular to the direction of scan.

Also disclosed in US 2008-0212046 is a gas knife positioned radially outside the main liquid retrieval feature. The gas knife traps any liquid which gets past the main liquid retrieval feature. Such a gas knife may be present in a so called gas drag principle arrangement (as disclosed in US 2008-0212046), in a single or two phase extractor arrangement (such as disclosed in Unites States patent application publication no. US 2009-0262318) or any other arrangement.

Many other types of liquid supply system are possible. The present invention is not limited to any particular type of liquid supply system. As will be clear from the description below, an embodiment of the present invention may use any type of localized liquid supply system. An embodiment of the invention is particularly relevant to use with any localized liquid supply system as the liquid supply system. Furthermore, the invention is not limited to lithographic apparatus in which imaging is done through an immersion fluid or liquid.

Many sensors used in a lithographic apparatus rely on a beam of radiation passing from an emitter to a mark. The mark may be a sensor, may be a mark in front of a sensor or may be a mark which redirects (e.g., reflects, refracts, diffracts) the beam from the emitter to a receiver. Sensors of this type can have errors and/or inaccuracies as a result of the sensor beam path which the beam takes from the sensor to the mark (and onwards) not being of a completely uniform material. For example, dust in the sensor beam path, liquid from, for example, an immersion fluid supply system, or fluid (e.g. gas) with varying temperature and/or composition and/or humidity can all result in inaccuracy and/or error in the reading of the sensor. In the case of non-uniform fluid, a variation in composition of the fluid and/or temperature and/or humidity can result in a change of refractive index and thereby introduce an error or inaccuracy into the reading of the sensor.

Fluid between an emitter and a mark (and between the mark and the receiver) may be conditioned to reduce or minimize changes of the refractive index of the fluid through which the sensor beam passes. In one example, a turbulent flow of gas is used to mix the temperature conditioned gas. In this way, a local difference in temperature, humidity or pressure is divided over the entire volume of the conditioned gas (along the length of the sensor beam path), resulting in substantially constant gas properties over the entire length of the sensor beam path.

A disadvantage of turbulent flow is that it also mixes in unconditioned gas from the environment adjacent the sensor. This unconditioned gas can then find its way into the sensor beam path resulting in error. This is because the unconditioned gas may be of a different temperature, humidity and/or composition (of gases) or may contain particles. The mixture of the unconditioned gas with the conditioned gas can have a negative effect on the stability of the refractive index of the gas in the sensor beam path. This reduces the accuracy of the sensor.

A turbulent flow results in a high uniformity of refractive index in the beam path of the sensor. A fundamental drawback of a turbulent flow is the high amount of unconditioned gas that is entrained in the turbulence, leading to low absolute refractive index stability.

A high stability of refractive index can be obtained by making a laminar flow of gas in the sensor beam path. A laminar flow of gas does not substantially entrain unconditioned gas. This therefore leads to low sensor noise and high stability at rest. However, during movement of a component of the sensor relative to another component of the sensor (such as in some sensors used in a lithographic projection apparatus), a laminar flow can create a high refractive index gradient (non-uniformity) which can lead to systematic measurement errors.

An embodiment of the present invention combines the low static noise properties of a laminar flow with high dynamic mixing properties of turbulent flow.

An embodiment of the present invention is described below with reference to a sensor such as that described in United States patent application publication no. US 2010/0157263, hereby incorporated in its entirety by reference, although an embodiment of the invention can be applied to any sensor in which an emitter projects a beam of radiation to a mark. Such a sensor comprises an emitter 20 to project a beam B of radiation onto a mark 30. The mark 30 redirects the beam B of radiation projected by the emitter 20 to a receiver 40 which, in an embodiment, is positioned next to the emitter 20. The path which the beam of radiation B (the sensor beam path illustrated in dashed lines) is conditioned by a flow of fluid illustrated by arrows drawn in solid lines in FIG. 6. The description below assumes the fluid to be gas but could equally well be liquid.

Figure 8:
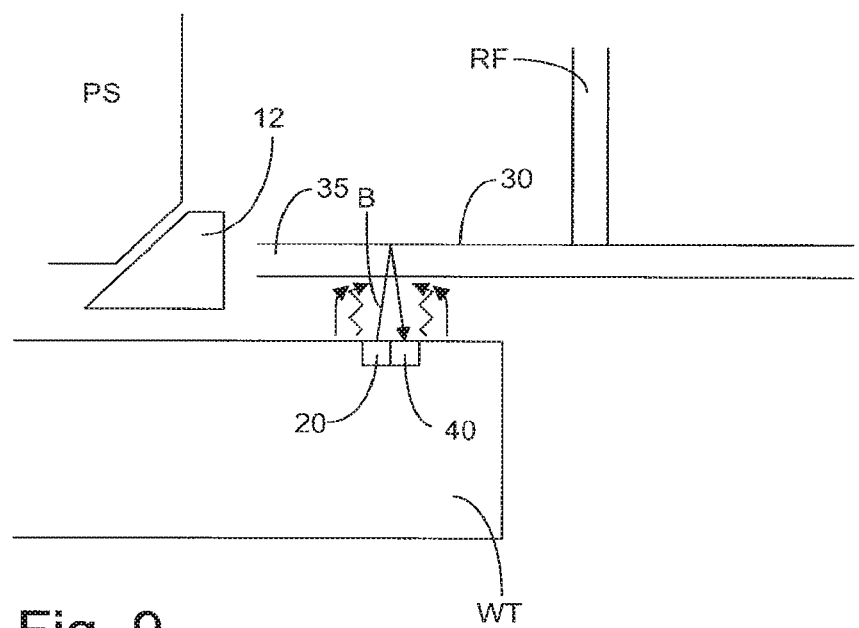
FIG. 8 illustrates, in cross-section, the position of a sensor in a lithographic apparatus according to an embodiment of the present invention.

In FIG. 6 the emitter 20 and receiver 40 are mounted on a substrate table WT. The mark 30 is mounted in fixed relation relative to a reference position, for example relative to the projection system PS of the lithographic apparatus as illustrated in FIG. 8. The emitter 20 and receiver 40 may be mounted in a fixed relation relative to the reference position and the mark 30 may be mounted on the substrate table WT as illustrated, for example in FIGS. 9-11. Additionally the sensor may be used to measure the position of a table other than a substrate table (for example a measurement table which carries one or more sensors and does not support a substrate as does a substrate table WT). Alternatively, the sensor may be used to measure the position of the support structure MT to support the patterning device MA. Furthermore, the an embodiment of the present invention may be applied to other sorts of sensors. For example, the an embodiment of the invention may be applied to an interferomic sensor system which measures the position of a table, for example the substrate table or another object. Additionally, an embodiment of the invention may be applied to other types of sensors including dose sensors, SMASH sensors (a self-referencing interferometer used for alignment with a symmetrical mark, for example as described in European patent application publication no. EP-A-1,148,390, hereby incorporated in its entirety by reference), transmission image sensors, alignment sensors and level sensors. An embodiment of the present invention is suited for a sensor in which the emitter 20 and mark 30 and/or the receiver 40 and mark 30 are separated only by a few centimeters, for example by 10 cm or less, desirably by 5 cm or less.

The sensor of FIG. 6 measures the position of the substrate table WT relative to the mark 30 in the XY plane (the plane of a top surface of the substrate table WT) as well as in the orthogonal Z direction (the direction of the optical axis of the apparatus). The sensor measures the position to subnanometer accuracy. Due to the working principle of the sensor, the sensitivity to refractive index variation is different for the X and Y directions compared to the Z direction. The XY accuracy of the sensor depends upon a high refractive index uniformity along the sensor beam path whereas Z accuracy demands a high absolute refractive index stability.

Thermally conditioned gas is provided by a source 50. Because the emitter 20 and receiver 40 are provided on a moving object, the gas flow should maintain uniformity and stability both during movement of the substrate table WT at up to 2 m/s relative to the mark 30 (such as a grid) as well as at standstill. Additionally, the gas flow should be robust against other gas disturbances in the lithographic apparatus.

FIG. 6 discloses a lithographic apparatus comprising a sensor, a first outlet 110 and a second outlet 120. The sensor comprises an emitter 20 to project a beam B of radiation along a sensor beam path to a mark 30. The first outlet 110 provides a turbulent fluid flow along the sensor beam path. The second outlet 120 provides a laminar fluid flow substantially enclosing the turbulent fluid flow.

The first outlet 110 may be provided adjacent the emitter 20 and receiver 40. The first outlet 110 is arranged to provide a gas from the source 50. On exiting the outlet 110, the gas moves to the sensor beam path. The gas may be a mixture of gases or may be a single gas, for example an inert gas such as nitrogen. The gas may be conditioned in terms of its temperature, its humidity and/or composition. The first outlet 110 may be constructed to provide a thermally conditioned gas. The first outlet 110 may be constructed to provide gas with a first flow characteristic. The first outlet 110 is configured to provide the first fluid as turbulent flow. For example, the first flow characteristic may be a Reynolds number of greater than 4000, desirably greater than 8000.

The first outlet 110 may be a single continuous outlet or a series of outlets such as discrete outlets in a line. The first outlet 110 is configured such that the gas exiting it surrounds the sensor beam path and/or flows into the sensor beam path. In one embodiment the first outlet 110 surrounds the emitter 20 and/or the receiver 40, as illustrated in FIG. 7.

The second outlet 120 is provided. The second outlet 120 may be associated with the first outlet 110. The second outlet 120 is constructed and arranged to provide a flow of gas from the source 50. The gas from the second outlet 120 may be provided adjacent the gas from the first outlet 110. The second outlet 120 may be constructed and configured to provide a thermally conditioned gas. The second outlet 120 may be constructed and configured to provide gas with a second flow characteristic. The second flow characteristic may be different from the first flow characteristic. The second outlet 120 is configured to provide the gas with the second flow characteristic as a laminar flow. For example, the second outlet is configured to provide the gas with a Reynolds number of less than 2300, desirably less than 2000. The flow of gas out of the second outlet 120 acts as a shield to substantially prevent non-conditioned gas radially outwardly of the second outlet 120 with respect to an optical axis of the sensor from being entrained by the turbulent flow of the gas exiting the first outlet 110. Thus the second outlet 120 is configured such that the flow of the second gas substantially prevents non-conditioned gas reaching the sensor beam path. Non-conditioned gas may have particles, a composition, a temperature and/or an amount of humidity that may disturb the beam B.

The second outlet 120 is on a side of the first outlet 110 opposite to a side of the first outlet 110 on which the emitter 20 and receiver 40 are provided.

Figure 7:
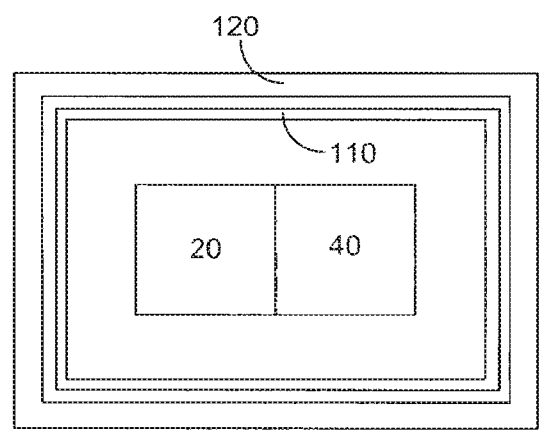
FIG. 7 illustrates a sensor, in plan, of an embodiment of the present invention.

As can be seen in FIG. 7, both the first outlet 110 and second outlet 120 surround the emitter 20 and receiver 40. The second outlet 120 may surround the first outlet 110. The first and second outlets 110, 120 may be concentric. The emitter 20 and receiver 40 are positioned within the first outlet 110.

The first and second outlets 110, 120 provide gas flow as illustrated in FIG. 6. The gas flow is in a direction substantially parallel to a direction of the sensor beam path. That is, the flow is towards the mark 30. The inner flow through the first outlet 110 is turbulent. The turbulent flow entrains fluid from the laminar flow exiting the second outlet 120. This helps ensure good dynamic mixing properties when the substrate table WT is moving at high speed. This helps result in low systematic XY position measurement error. Additionally it helps solve the problem of entrapment of unconditioned gas by the turbulent flow by actively supplying gas just outside of the turbulent flow. The laminar flow essentially acts as a seal, by blowing away any unconditioned gas that is about to enter the conditioned gas volume. The unconditioned gas stays outside of the laminar flow and is substantially prevented from entering the conditioned volume.

A significant reduction in the amount of unconditioned gas inside the volume defined between the mark 30, the substrate table WT and the first outlet 110 is achievable. Where only the first outlet 110 is provided, that volume may contain 51%, 54% and 62% unconditioned gas for scan speeds of 0, 0.7 and 1.4 m/s respectively. In contrast, with the provision of the second outlet 120 providing a laminar flow, the percentage of unconditioned gas in the space may fall to 0%, 2% and 5-6% for movement speeds of 0, 0.7 and 1.4 m/s respectively. This shows a significant improvement and leads to a three times reduction in noise in the measurement results in all directions of measurement.

A radial inward flow of the gas exiting the first and second outlets 110, 120 is achieved by providing an inlet 130 radially outwardly of the emitter 20 and receiver 40 and radially inwardly of the first outlet 110. That is, the inlet 130 is provided on the same side of the sensor as the emitter 20 and receiver 40 (as opposed to being provided adjacent the mark 30). Additionally, the inlet 130 is provided on the same side of the sensor as the first and second outlets 110, 120.

In order to achieve the different flow characteristics of fluids exiting the first and second outlets 110, 120, the cross sectional areas of the first and second outlets 110, 120 may be different as illustrated, assuming that both outlets 110, 120 are attached to the same source and with the same pressure. In this way, the gas exiting the second outlet 120 has a lower velocity than that exiting the first outlet 110 thereby achieving laminar flow. The turbulent flow is achieved by the high exit velocity of the gas exiting the first outlet 110. Other ways of achieving the different flow characteristics are possible such as providing the gas out of the first and second outlets 110, 120 at different pressures, or by encouraging turbulent flow by placing flow restrictions or obstacles in the first outlet 110.

As with the first outlet 110, the second outlet 120 and inlet 130 may comprise one or more openings. The first and second outlets 110, 120 and the inlet 130 face the mark and/or are in a surface in which the emitter 20 is mounted.

In FIG. 6 the gas flows out of the outlets 110, 120 are shown as being perpendicular to the surface in which the outlets 110, 120 are formed. This is not necessarily the case and the flows could be angled radially inwardly towards the sensor beam path, for example. This could be achieved, for example, by angling the conduits which provide gas to the outlets 110, 120 away from being perpendicular to the plane of the surface.

Instead of nitrogen, argon or any gas or mixture of gases or even liquid which is compatible with the apparatus and has a substantially constant refractive index at a given temperature can be used. As explained above, the combination of first and second outlets 110, 120 with gas exiting with a different flow characteristic can be used on other types of sensor. For example, a different type of sensor may replace a reflective mark 30 with a transmissive mark and provide the receiver 40 on the other side of the mark 30 to the emitter 20. The same principles as described herein could be applied to such a system in which a turbulent flow is provided radially inwardly of a laminar flow to prevent unconditioned gas being sucked into the sensor beam path by the turbulent flow.

FIG. 8 shows, in cross-section, how the components of FIG. 6 may be assembled into a lithographic apparatus. In FIG. 8 the substrate table WT is positioned under the projection system PS and immersion fluid supply system 12. The emitter 20 and receiver 40 are positioned at an edge of the substrate table WT. The beam B from the emitter 20 is projected towards a mark 30 of a mark structure 35 which is held above the substrate table WT in a known position, relative to the projection system PS. For example the mark 30 may be held by the reference frame RF. The mark 30 surrounds, in plan, the projection system PS and the substrate table WT is provided with at least three emitter 20/receiver 40 combinations such that the position of the substrate table WT relative to the mark 30 and thereby the projection system PS can be measured as is described in United States patent application publication no. US 2010/0157263. The mark 30 is formed on a surface of the mark structure 35 which faces away from the emitter 20/receiver 40. Therefore, the beam B from the emitter 20 passes through the mark structure 35 (which may be a plane parallel plate of quartz, for example) before impinging on the mark 30 and being redirected back through the mark structure 35 and then through the atmosphere to the receiver 40. Any droplets or contamination on the surface of the mark structure 35 facing the emitter 20/receiver 40 could interfere with the beam B thereby resulting in erroneous measurement and/or no measurement at all. The principles described elsewhere apply equally to such an arrangement as illustrated in FIG. 8 as well as to the other arrangements illustrated where the mark 30 is on a surface facing the emitter 20/receiver 40.

Figure 9:
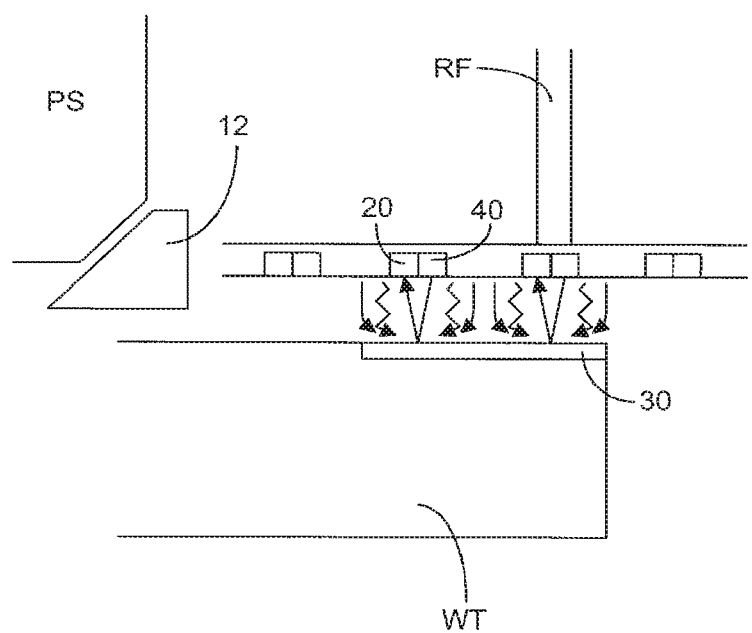
FIG. 9 illustrates, in cross-section, a sensor according to a further embodiment of the present invention.
Figure 11:
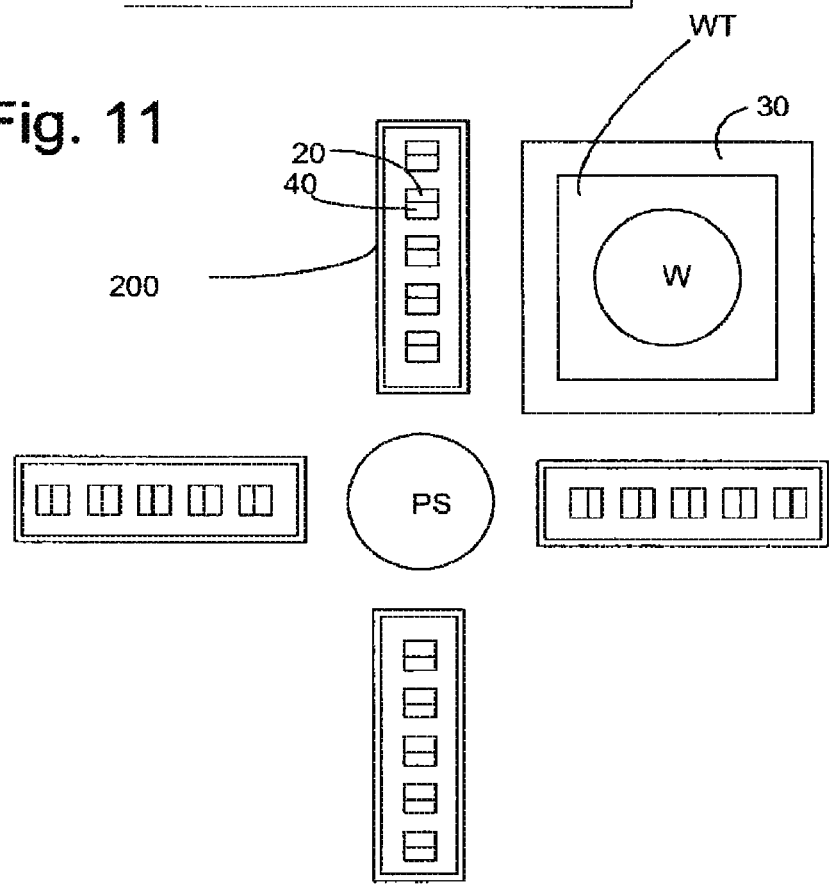
FIG. 11 illustrates, in plan, the embodiment of FIG. 10.

In FIG. 9 the mark 30 is provided on the substrate table WT and the emitter 20/receiver 40 combination is provided is fixed relative to the projection system PS. Otherwise the embodiments of FIGS. 8 and 9 are the same. In order to keep the footprint, in plan, of the substrate table WT to a reasonable size, the mark 30 is provided around an edge of a substrate table WT. The size of the mark 30 is not large enough so that only a single emitter 20/receiver 40 combination can be used. Therefore a plurality of emitter 20/receiver 40 combinations are provided and those under which the mark 30 is at any given time can be used to make a reading of the position of a substrate table WT. Such a system is described, for example, in United States patent application publication no. US 2007/0288121, which is hereby incorporated in its entirety by reference. FIG. 11, shows in plan, an arrangement of emitter 20/receiver 40 combinations.

A difficulty with providing the mark 30 on the substrate table WT is that the immersion liquid supply system 12 will at a certain moment need to cross the mark 30, for example during substrate table swap under the projection system PS. This can result in immersion liquid being left behind upon the mark 30. Such immersion liquid left behind on the mark 30 can be in the sensor path and thereby interfere with the reading made by the sensor. This can lead to errors in the sensor system. The use of gas flows as illustrated in FIG. 9 can be used to move a droplet on the mark 30 out of the sensor beam path. This is an additional advantage to that already described above with reference to FIG. 6.

Figure 10:
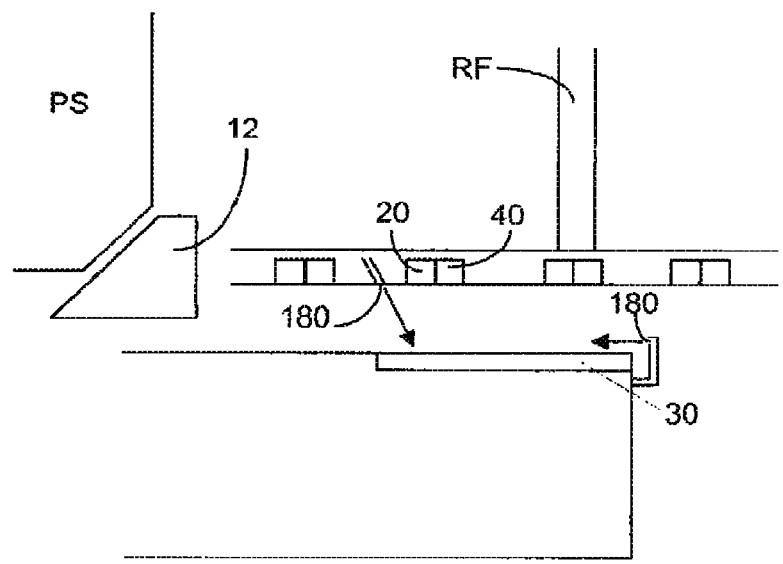
FIG. 10 illustrates, in cross-section, a further embodiment of the present invention.

FIG. 10 shows a cross section of a further embodiment which is the same as that shown in FIG. 9 except as described below. Instead of providing first and second outlets 110, 120, in FIG. 10 two examples of possible alternative outlets 180 are illustrated. The alternative outlets 180 provide a flow of gas for the movement of a droplet of liquid on the mark 30. In one embodiment the outlet 180 is provided in a surface in which the emitter 20/receiver 40 is provided. In a further embodiment the additional outlet 180 is provided on the substrate table WT. The outlet 180 may be configured to direct the flow of gas at an angle other than 90° to the surface of the mark 30. This may be more effective in moving liquid on the mark 30. However a flow of gas perpendicular in direction to the surface of the mark 30 will also be effective. For example, relative movement of the substrate table WT relative to the flow may be effective to move a droplet of liquid on the mark 30 out of the sensor beam path.

A further embodiment is illustrated in FIG. 11 which shows a system similar to that of FIG. 9 in plan. However only a single outlet 200 is provided to direct a flow of gas towards the mark 30. The single outlet 200 can surround one or more combinations of emitter 20/receiver 40 though this is not necessarily the case. For example, each emitter 20/receiver 40 could be provided with an individual outlet 200. In one embodiment the flow of gas through the outlet 180/200 is switchable so that the flow of gas only occurs when the mark 30 is under the associated emitter 20/receiver 40 combination. The flow of gas out of the outlet 200 provides a barrier (for example a gas curtain) which does not allow droplets to pass or moves a droplet already present out of the way. Therefore, the flow of gas out of outlet 200 is to move a droplet of liquid and/or prevent a droplet of liquid moving onto the mark 30.

In an embodiment, there is provided a lithographic apparatus comprising a sensor, a first outlet and a second outlet. The sensor comprises an emitter to project a beam of radiation along a sensor beam path to a mark. The first outlet provides a turbulent fluid flow along the sensor beam path. The second outlet provides a laminar fluid flow substantially enclosing the turbulent fluid flow. The turbulent and/or laminar flow may be thermally conditioned.

The second outlet may be on a side of the first outlet opposite to a side of the first outlet on which the emitter and/or mark is provided.

The turbulent fluid flow may have a Reynolds number of greater than 4000. The laminar fluid flow may have a Reynolds number of less than 2300.

The second outlet may be configured such that the laminar fluid flow substantially prevents non-conditioned fluid from reaching the sensor beam path.

The first and second outlets may be configured to provide fluid in a direction substantially parallel to a direction of propagation of the beam.

The first outlet may be configured such that the turbulent fluid flow surrounds the sensor beam path.

The first outlet may surround the emitter and/or the mark. The first outlet may comprise one or more openings. The second outlet may surround the first outlet. The second outlet may comprise one or more openings.

The sensor may further comprise a receiver and the mark may reflect the beam of radiation from the emitter to the receiver.

The lithographic apparatus may further comprise a table to support a substrate. The sensor may be configured to measure a position of the table relative to a reference point.

The emitter or the mark may be mounted on the table. The other of the emitter and the mark may be mounted in fixed relation relative to the reference point.

The lithographic apparatus may further comprise an immersion fluid supply system configured to provide immersion fluid between a projection system of the lithographic apparatus and a substrate. The first outlet and/or the second outlet may be configured such that fluid exiting the first and/or second outlet is effective to move a droplet on the mark and/or the emitter such that the droplet does not interfere with the beam of radiation. The fluid may be a gas.

In an embodiment, there is provided a lithographic apparatus comprising a table, a fluid supply and a sensor. The table is arranged to be positioned under a projection system. The fluid supply system is configured to provide a fluid between the projection system and the table. The sensor is configured to measure a position of the table relative to a reference position. The sensor comprises an emitter and a mark structure comprising a mark. The emitter is fixed relative to a reference position and the mark is positioned on the table, or the emitter is positioned on the table and the mark is fixed relative to a reference position. The lithographic apparatus further comprises an outlet to provide a flow of gas to move a droplet of liquid on and/or prevent a droplet of liquid moving onto the mark structure and/or the emitter. The flow of gas may move a droplet from the mark structure or the emitter. Alternatively or additionally, the flow of gas may prevent a droplet moving onto the mark structure or the emitter.

In an embodiment, there is provided a device manufacturing method comprising projecting a patterned beam of radiation onto a substrate; measuring a property using an emitter to project a beam of radiation along a sensor beam path to a mark; providing a first flow of thermally conditioned fluid with a first characteristic to at least part of the sensor beam path; and providing a second flow of thermally conditioned fluid with a second flow characteristic. The second flow characteristic is different to the first flow characteristic and is provided adjacent the thermally conditioned fluid from the first outlet.

In an embodiment, there is provided a device manufacturing method, comprising: projecting a patterned beam of radiation through an immersion liquid onto a substrate positioned on a table; measuring a position of the table relative to a reference position using an emitter to emit a beam of radiation on to a mark of a mark structure. The emitter is fixed relative to a reference position and the mark is positioned on the table or the emitter is positioned on the table and the mark is fixed relative to a reference position. The method further comprises providing a flow of gas to move a droplet of liquid on and/or prevent a droplet of liquid from moving onto the mark structure and/or emitter. The flow of gas may move a droplet from the mark structure or the emitter. Alternatively or additionally, the flow of gas may prevent a droplet moving onto the mark structure or the emitter.

Although specific reference may be made in this text to the use of lithographic apparatus in the manufacture of ICs, it should be understood that the lithographic apparatus described herein may have other applications in manufacturing components with microscale, or even nanoscale features, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm).

The term "lens", where the context allows, may refer to any one or combination of various types of optical components, including refractive and reflective optical components.

While specific embodiments of the invention have been described above, it will be appreciated that the invention may be practiced otherwise than as described. For example, the embodiments of the invention may take the form of a computer program containing one or more sequences of machine-readable instructions describing a method as disclosed above, or a data storage medium (e.g. semiconductor memory, magnetic or optical disk) having such a computer program stored therein. Further, the machine readable instruction may be embodied in two or more computer programs. The two or more computer programs may be stored on one or more different memories and/or data storage media.

The controllers described above may have any suitable configuration for receiving, processing, and sending signals. For example, each controller may include one or more processors for executing the computer programs that include machine-readable instructions for the methods described above. The controllers may also include data storage medium for storing such computer programs, and/or hardware to receive such medium.

One or more embodiments of the invention may be applied to any immersion lithography apparatus, in particular, but not exclusively, those types mentioned above, whether the immersion liquid is provided in the form of a bath, only on a localized surface area of the substrate, or is unconfined on the substrate and/or substrate table. In an unconfined arrangement, the immersion liquid may flow over the surface of the substrate and/or substrate table so that substantially the entire uncovered surface of the substrate table and/or substrate is wetted. In such an unconfined immersion system, the liquid supply system may not confine the immersion liquid or it may provide a proportion of immersion liquid confinement, but not substantially complete confinement of the immersion liquid.

A liquid supply system as contemplated herein should be broadly construed. In certain embodiments, it may be a mechanism or combination of structures that provides a liquid to a space between the projection system and the substrate and/or substrate table. It may comprise a combination of one or more structures, one or more liquid inlets, one or more gas inlets, one or more gas outlets, and/or one or more liquid outlets that provide liquid to the space. In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the liquid.

The descriptions above are intended to be illustrative, not limiting. Thus, it will be apparent to one skilled in the art that modifications may be made to the invention as described without departing from the scope of the claims set out below.

The invention claimed is:

1. A lithographic apparatus comprising:
   a first component having a first surface;
   a second component having a second surface, wherein at least the second component is configured to move relative to the first component in a motion direction and the first and second surfaces are arranged to face each other; and
   at least one opening provided at the first surface or the second surface, the at least opening configured to provide a flow of gas therefrom to establish a gas curtain that encloses part of a protected volume of gas between the first and second surfaces and that reduces or prevents an inflow of ambient gas into the protected volume of gas, wherein the gas flow is incident onto the other of the first or second surface and wherein the gas curtain has a geometry in a plane perpendicular to a direction of the flow of gas and in which the motion direction lies, and the geometry has a corner.

2. The apparatus of claim 1, wherein the geometry comprises at least two corners along a diagonal passing through a central portion of the geometry.

3. The apparatus of claim 2, wherein the geometry is symmetrical, and/or wherein the geometry is elongate in a direction of the diagonal, and/or wherein a direction of the diagonal is tilted with respect to a side of the geometry.

4. The apparatus of claim 1, wherein the at least opening comprises an opening having an elongate cross-sectional shape with a corner.

5. The apparatus of claim 1, wherein an opening of the at least one opening is an inner opening inward, relative to the protected volume, of another opening at the first or second surface configured to provide another gas flow, the inner opening providing a turbulent flow of gas, and/or wherein an opening of the at least one opening is an outer opening outward, relative to the protected volume, of another opening at the first or second surface configured to provide another gas flow, the outer opening providing a laminar flow of gas.

6. The apparatus of claim 1, configured such that a radiation beam passes through the protected volume.

7. The apparatus of claim 6, wherein the radiation beam is a radiation beam directed to a sensor.

8. The apparatus of claim 7, wherein the first and/or second component has/have at least one target thereon for detection by the sensor.

9. The apparatus of claim 7, wherein the first component comprises a reference frame and the second component comprises a substrate table.

10. The apparatus of claim 1, wherein the at least one opening comprises a first opening to provide a first fluid flow with a first fluid characteristic and a second opening to provide a second fluid flow substantially enclosing the first fluid flow, the second fluid flow having a second fluid characteristic different than the first fluid characteristic.

11. A device manufacturing method comprising:
    moving a first component of a lithographic apparatus in a motion direction relative to a second component of the lithographic apparatus, wherein a first surface of the first component faces a second surface of the second component;
    providing a flow of gas from at least one opening provided at the first surface or the second surface, the flow of gas establishing a gas curtain that encloses part of a protected volume of gas between the first and second surfaces and that reduces or prevents an inflow of ambient gas into the protected volume of gas, wherein the gas flow is incident onto the other of the first or second surface and wherein the gas curtain has a geometry in a plane perpendicular to a direction of the flow of gas and in which the motion direction lies, and the geometry has a corner; and
    transferring a pattern onto a substrate in the lithographic apparatus.

12. The method of claim 11, wherein the geometry comprises at least two corners along a diagonal passing through a central portion of the geometry.

13. The method of claim 12, wherein the geometry is symmetrical, and/or wherein the geometry is elongate in a direction of the diagonal, and/or wherein a direction of the diagonal is tilted with respect to a side of the geometry.

14. The method of claim 11, wherein the at least opening comprises an opening having an elongate cross-sectional shape with a corner.

15. The method of claim 11, wherein an opening of the at least one opening is an inner opening inward, relative to the protected volume, of another opening at the first or second surface configured to provide another gas flow, the inner opening providing a turbulent flow of gas, and/or wherein an opening of the at least one opening is an outer opening outward, relative to the protected volume, of another opening at the first or second surface configured to provide another gas flow, the outer opening providing a laminar flow of gas.

16. The method of claim 11, configured such that a radiation beam passes through the protected volume.

17. The method of claim 11, wherein the at least one opening comprises a first opening to provide a first fluid flow with a first fluid characteristic and a second opening to provide a second fluid flow substantially enclosing the first fluid flow, the second fluid flow having a second fluid characteristic different than the first fluid characteristic.

18. A lithographic apparatus comprising:
- a sensor system configured to provide a beam of radiation onto a target area and detect radiation from the target area;
- a reference frame having a first surface;
- a table movable relative to the reference frame in a motion direction, the table having a second surface arranged to face the first face; and
- at least one opening provided at the first surface or the second surface, the at least opening configured to provide a flow of gas therefrom to establish a gas curtain that encloses the target area and that reduces or prevents an inflow of ambient gas into a volume of gas adjacent the target area, wherein the gas flow is incident onto the other of the first or second surface and wherein the gas curtain has a geometry in a plane perpendicular to a direction of the flow of gas and in which the motion direction lies, and the geometry has a corner.

19. The apparatus of claim 18, wherein the geometry comprises at least two corners along a diagonal passing through a central portion of the geometry.

20. The apparatus of claim 18, wherein the at least opening comprises an opening having an elongate cross-sectional shape with a corner.

* * * * *